(12) United States Patent
Arguelles

(10) Patent No.: US 7,026,865 B2
(45) Date of Patent: Apr. 11, 2006

(54) ANALOGUE AMPLIFIER WITH MULTIPLEXING CAPABILITY

(75) Inventor: Javier Arguelles, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/762,960

(22) Filed: Jan. 21, 2004

(65) Prior Publication Data

US 2004/0150469 A1 Aug. 5, 2004

(30) Foreign Application Priority Data

Jan. 23, 2003 (EP) ................................. 03001327

(51) Int. Cl.
*G01R 19/00* (2006.01)
*G01R 21/00* (2006.01)
*G01R 23/00* (2006.01)

(52) U.S. Cl. ........................ 330/2; 330/252; 330/253; 330/273

(58) Field of Classification Search .................. 333/2, 333/252–253, 273
See application file for complete search history.

(56) References Cited

U.S. PATENT DOCUMENTS

| 4,546,327 A | | 10/1985 | Suzuki et al. |
| 4,829,266 A | * | 5/1989 | Pernici et al. ............... 330/253 |
| 4,896,118 A | * | 1/1990 | Johnson ........................ 330/2 |
| 5,006,812 A | * | 4/1991 | Erickson ....................... 330/2 |
| 5,585,763 A | | 12/1996 | Navabi et al. |
| 5,631,602 A | * | 5/1997 | Kearney et al. ............... 330/2 |
| 5,907,259 A | * | 5/1999 | Yamada et al. ............. 327/563 |
| 6,064,256 A | * | 5/2000 | Mizunaga ...................... 330/2 |
| 6,107,883 A | | 8/2000 | Xu |

FOREIGN PATENT DOCUMENTS

EP 0475118 8/1991

* cited by examiner

*Primary Examiner*—Peguy Jeanpierre
*Assistant Examiner*—Khai Nguyen
(74) *Attorney, Agent, or Firm*—Maginot, Moore & Beck

(57) ABSTRACT

An analogue amplifier with multiplexing capability, without the need to incorporate a multiplexor, comprising an input port, a test input port, an output port, a control input to switch the amplifier between a normal amplifying mode and a test mode, wherein a analogue signal introduced to the input port is amplified to the output port in normal mode, and a test signal on the test port is routed to the output port when the amplifier is in test mode.

11 Claims, 9 Drawing Sheets

$Z(S,T) = k_1 S + k_2 T$   normal mode
$Z(S,T) = k_3 S + k_4 T$   test mode

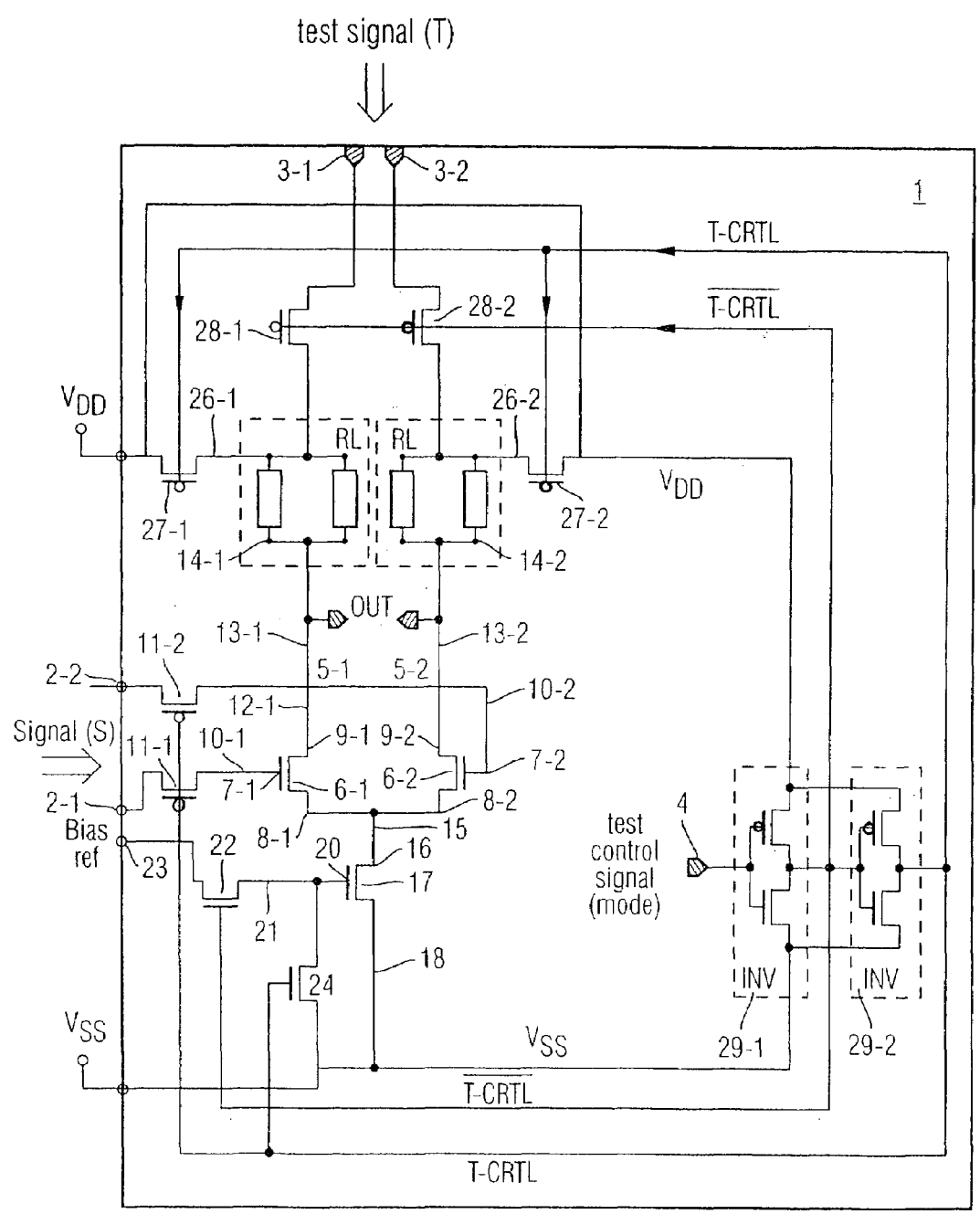

ANALOGUE AMPLIFIER WITH MULTIPLEXING CAPABILITY

FIELD OF THE INVENTION

The invention refers to an analogue amplifier to increase circuit testability by featuring additional multiplexing capability.

DESCRIPTION OF PRIOR ART

Any procedure carried out upon an integrated circuit intended to establish its quality, performance or reliability is commonly called testing.

Testing can be carried out at different stages during the development of an integrated circuit; different procedures are followed, according to particular goals and circuit type, for each development stage.

The degree to which an integrated circuit facilitates the establishment of test criteria and the performance of tests to determine whether those criteria have been met is commonly referred as testability.

According to existing literature, integrated circuits testability can be quantified by means of existing capacity to control and or to observe voltages on relevant nodes in the integrated circuit. These magnitudes are commonly referred as controllability and observability.

The twin requirements of high precision and accuracy in signal measurement are superimposed to those basic requirements of controllability and observability to establish proper test criteria for modern high-speed communication circuits. On the other hand, new technologies make more and more defects to be non-visible, new failure mechanisms emerge and a relevant number of circuit features are unsimulatable.

As a consequence, test cost and complexity increases, but also a higher risk exist to produce delays in bringing products to market or just to suffer from yield detractors that lead to higher manufacturing cost.

Setting up design procedures that include some constrains to increase circuit testability is a common approach to address that problem.

Testability can be improved either by increasing the controllability or the observability of some internal nodes. Identifying a testability issue, and therefore choosing proper nodes upon which to act in order to improve their observability or their controllability is most of the times an ad hoc issue.

Conventional approach to raise up internal nodes controllability or observability uses multiplexors to provide alternative signal paths. However, because of the ad-hoc nature of the task, top level floor plan layout constrains may lead to situations where it is not possible to include new multiplexor blocks in the original design without severe impact upon schedule because of the re-design effort due.

FIG. 1 shows a not accessible node in the signal path which is driven by an analogue amplifier. To test such a not accessible node a design for test solution according to the state of the art is shown in FIG. 2. For access to the node a multiplexor is provided so that a test signal can be applied directly to the node (e.g. from an external signal generator). The multiplexor is controlled by a mode control signal which switches between a test signal T and the amplified normal signals S of the signal path. All signals are differential signals.

The drawback of a multiplexor-based solution is that the load capacitance is increased. Further providing a multiplexor increases the necessary area on the chip such increasing production costs. A further drawback is that because of the additional multiplexor the power consumption is increased.

SUMMARY OF THE INVENTION

Accordingly it is the object of the present invention to provide means which allow a better testability by increasing internal controllability.

Further advantages of the present invention are that the redesign effort is minimal, that the silicon area overhead is minimal and that the increase of the power supply current consumption is minimal.

The basic idea of the present invention is that in the main signal propagation path of analogue integrated circuits a number of amplifiers are provided to drive proper internal nodes in order and to guarantee the required signal to noise ratio. Whenever a controllability issue is detected the design of some amplifier is modified to include multiplexing capabilities that allow injecting test signals within the main signal propagation path with minimal redesign effort and minimal impact upon normal operation mode of the required amplification function.

In accordance with one aspect, the invention provides an analogue amplifier with multiplexing capability comprising an input port, a test input port, an output port, a control input to switch the amplifier between a normal amplifying mode and a test mode, wherein a analogue signal introduced to the input port is amplified to the output port in normal mode, and a test signal on the test port is routed to the output port when the amplifier is in test mode.

The test signal is generated in a first embodiment by a built in test pattern generator.

The test signal is applied in an alternative embodiment via a pad from an external test pattern generator.

BRIEF DESCRIPTION OF THE DRAWINGS

FIG. 6 shows a preferred embodiment of the analogue amplifier according to the present invention;

DESCRIPTION OF THE PREFERRED EMBODIMENTS

Figure 1:
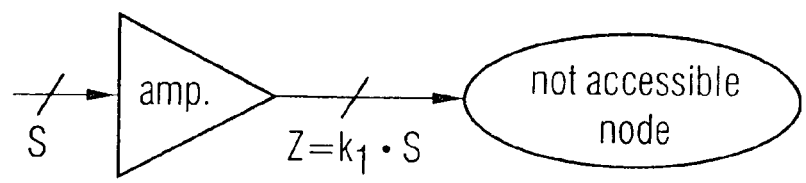
FIG. 1 shows the signal path in an analogue circuit according to the state of the art.
Figure 2:
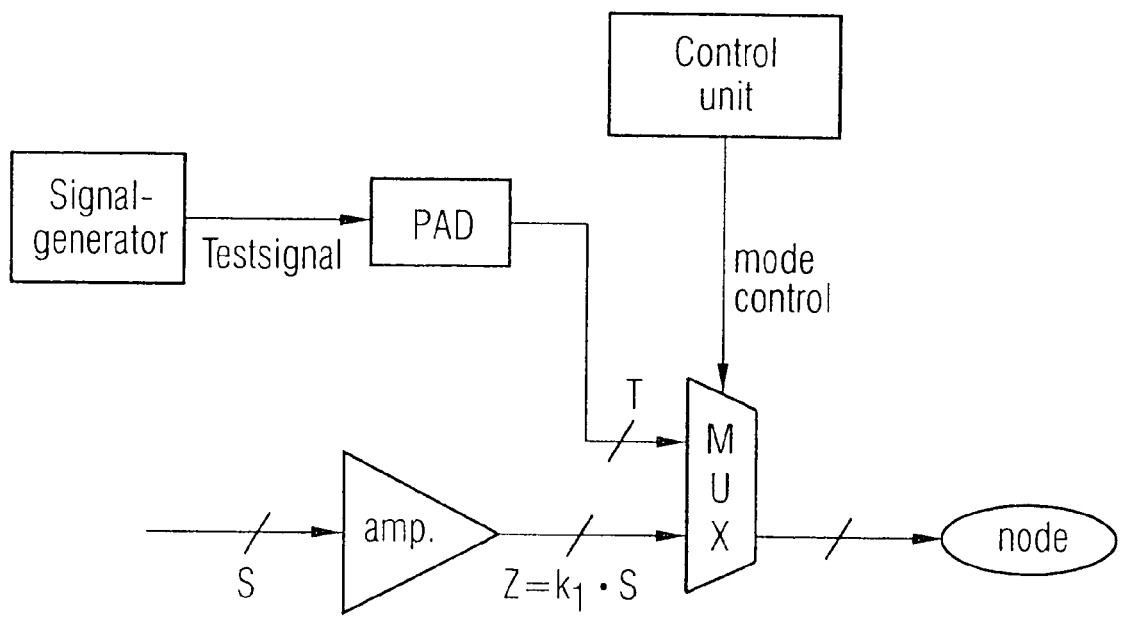
FIG. 2 shows a conventional approach to increase the controllability of an internal node non accessible from any primary input/output of the circuit under test.
Figure 3:
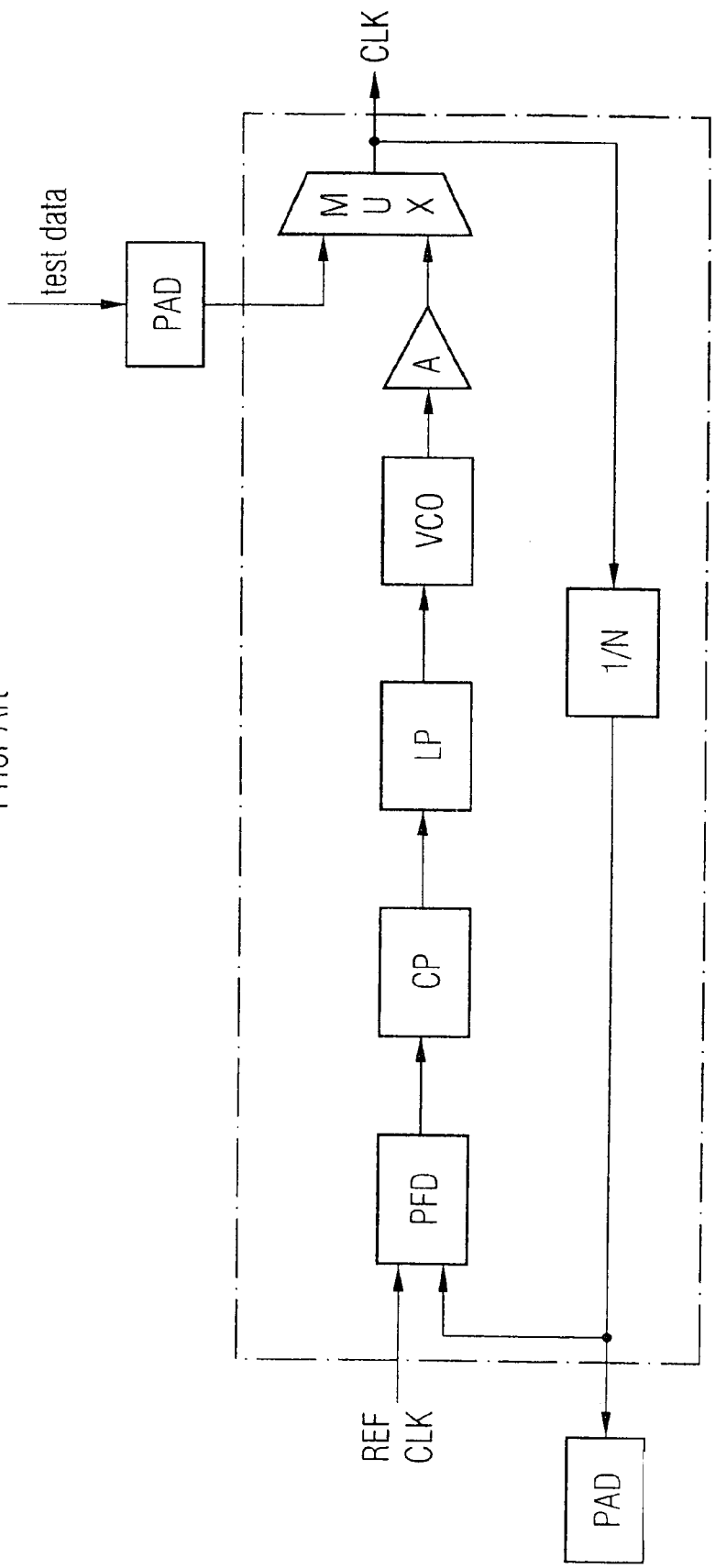
FIG. 3 shows a pll circuit with added multiplexor according to the state of the art to increase controllability by bypassing the amplified VCO output.
Figure 4:
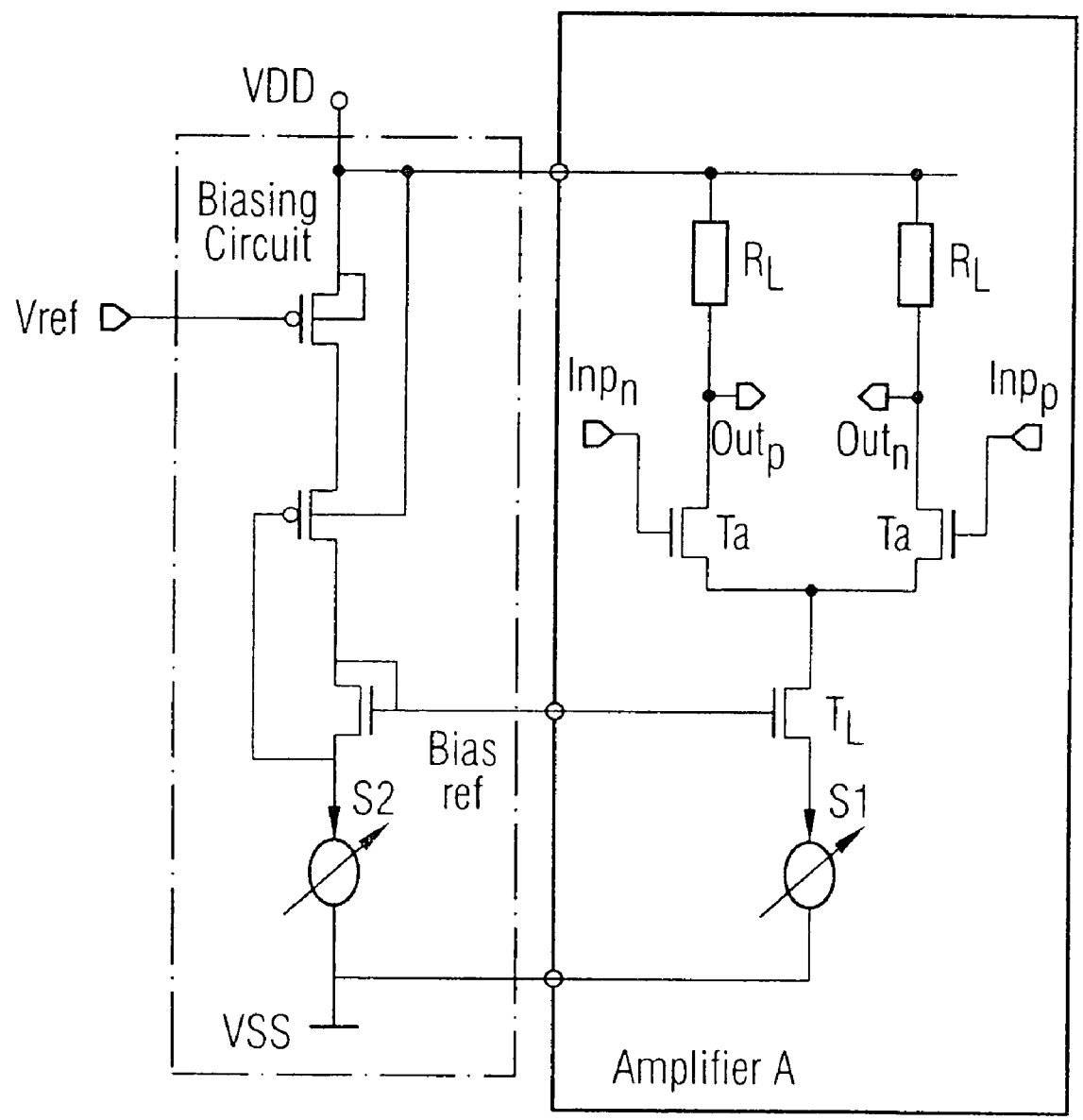
FIG. 4 shows a fully differential amplifier, tail current and bias generation according to the state of the art.

FIG. 3 shows a conventional approach for testing a phase locked loop, (pLL), circuit within mixed signal circuits. A phase locked loop is a system with induced feedback to maintain an output signal in a specific phase relationship with a reference signal. The pll-circuit shown in FIG. 3 comprises of phase frequency detector PFD controlling a charge pump CP which supplies a deviation signal to the low pass filter LP. The filtered signal is supplied to a voltage controlled oscillator VCO. The voltage controlled oscillator VCO is a circuit that produces an AC-output signal whose frequency is proportional to the input control voltage. The VCO output signal is amplified by a conventional amplifier as shown in FIG. 4. For test purposes a multiplexor is provided at the output of the amplifier in the conventional approach as shown in FIG. 3. In the feedback loop a division circuit is provided which produces an output signal whose frequency is an integer division of the input signal frequency. The VCO signal is fed back within the pLL-circuit through a high speed 1/N frequency divider. The proper operation of these frequency divider is essential to guarantee a good pLL-performance.

By providing a multiplexor to the output of amplifier A the load capacitance, the area overhead and the power supply consumption are increased.

FIG. 4 shows a conventional state of the art differential amplifier A. The amplifier A is connected to a biasing circuit. The conventional amplifier A as shown in FIG. 4 comprises two input terminals and two output terminals. The input terminals are connected to the gate terminals of amplifying MOS-transistors $T_a$. The source nodes of the amplifying transistors $T_a$ are connected at a common node to a tail current sink implemented by transistor $T_b$ having a gate which is biased by a reference voltage. The drain terminals of the amplifying transistors $T_a$ are connected via resistors to a positive supply voltage VDD.

According to the present invention the design of the conventional amplifier A as drawn in FIG. 4 is modified to increase the controllability of an internal node driven by said amplifier. Thus the testability of the circuit under test including said amplifier is increased too.

Figure 5:
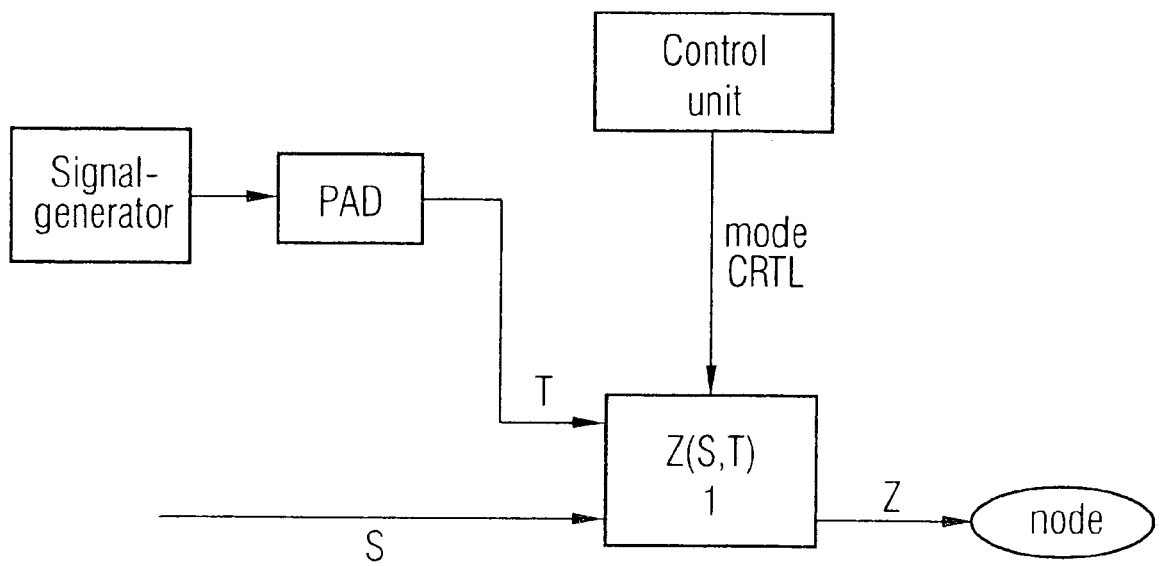
FIG. 5 shows an arrangement comprising an amplifier according to the present invention in order to increase the controllability of the circuit node driven by said amplifier.

FIG. 5 shows a block diagram of an analogue amplifier 1 according to the present invention. The analogue amplifier 1 according to the present invention as shown in FIG. 5 can be switched via a control mode signal between a first normal amplifying mode and a second test mode. A control mode signal is used to switch between both modes. The signal generator can be located externally or be built in.

The function of the amplifier 1 in the normal mode can be described as:

$$Z(S,T)=K_1 \times S + K_2 \times T$$

wherein S is the signal of the signal path,
T is the test signal and
$K_1$, $K_2$ are constants.

Since the function of the conventional amplifier to be modified can be described as:

$$Z(S)=K_1 \times S$$

the first constant $K_1$ of the modified amplifier according to the invention is as close as possible to the original amplifying constant $K_1$ of the conventional amplifier.

In the normal test node the constant $K_2$ of the analogue amplifier 1 according to the present invention is as small as possible ($K_2 \rightarrow 0$).

When the analogue amplifier 1 according to the present invention is switched to the test mode its operation can be described as:

$$Z(S,T)=K_3 \times S + K_4 \times T$$

In an ideal implementation of the differential amplifier 1 according to the present invention, the constant $K_3$ is zero to isolate the signal S of the signal path from the injected test signal T. The constant $K_4$ is close to or lower than one in an ideal implementation ($K_3=0$; $K_4 \leq 1$).

FIG. 6 shows a circuit diagram of a preferred embodiment of a differential analogue amplifier 1 according to the present invention. The analogue amplifier 1 is fully differential.

The differential analogue amplifier 1 comprises an input port 2-1, 2-2 for receiving an analogue signal S. The amplifier 1 further comprises a test input port 3-1, 3-2 for receiving a test signal T. Further a control input port 4 is provided for receiving a test control signal switching the amplifier 1 between a normal amplifying mode and a test mode. In the normal amplifying mode the amplifier 1 as shown in FIG. 6 amplifies the analogue signal S and transmits the amplified signal via an output port 5-1, 5-2 to an internal node within the integrated circuit. In the test mode the test signal T is transmitted to that internal node.

The amplifier 1 comprises an amplifying transistor 6-1, 6-2 having a gate terminal 7-1, 7-2, a source terminal 8-1, 8-2 and a drain terminal 9-1, 9-2. The gate terminals 7-1, 7-2 of the amplifying transistors 6-1, 6-2 are connected via lines 10-1, 10-2 and first switches 11-1, 11-2 to the signal input terminals 2-1, 2-2.

The drain terminals 9-1, 9-2 of the amplifying transistors 6-1, 6-2 are connected via lines 13-1, 13-2 to the output port 5-1, 5-2 of the amplifier 1. Connected to lines 13-1, 13-2 are resistors 14-1, 14-2. The source terminals 8-1, 8-2 of the amplifying transistors 6-1, 6-2 are connected via a line 15 to a drain terminal 16 of a tail current sink comprising a transistor 17 having a source terminal 18 connected to a second negative supply voltage $V_{ss}$. The current tail transistor 17 comprises a gate 20 connected via a line 21 and via a second switch 22 to a biasing reference voltage supplied to a terminal 23 of the amplifier 1. Line 21 further connects gate 20 of current tail transistor 17 to a drain terminal of a switching transistor 24. The gate 20 of the tail current transistor 17 can be switched by the third switch 24 to the negative supply voltage $V_{SS}$.

The load devices 14-1, 14-2 connected to the amplifying transistor 6-1, 6-2 are connected via lines 26-1, 26-2 and fourth switches 27-1, 27-2 to a positive supply voltage. The load devices 14-1, 14-2 a further connected via fifth switches 28-1, 28-2 to the test signal input port. All switches 11-1, 11-2, 22, 24, 27-1, 27-2, 28-1, 28-2 of the amplifier 1 are controlled by a test control mode signal applied to the amplifier by terminal 4. Two inverter circuits 29-1, 29-2 invert the test control mode signal, wherein the inverter circuit 29-1 supplies the signal not (T-CTRL) to switches 28-1, 28-2, and to switch 22, and wherein inverter circuit 29-2 supplies the signal T-CTRL to switches 11-1, 11-2, switch 24 and switches 27-1 and 27-2.

The following table shows the states of the switches within the amplifier 1 drawn in FIG. 6 according to the present invention.

| switch | test mode | normal mode |
|---|---|---|
| $S_{28-1}$, $S_{28-2}$ | On | Off |
| $S_{27-1}$, $S_{27-2}$ | Off | On |
| $S_{11-1}$, $S_{11-2}$ | Off | On |
| $S_{22}$ | Off | On |
| $S_{24}$ | On | off |

In the normal amplifying mode switch 24 and switch 28-1, 28-2 are switched off and switches 27-1, 27-2, 11-1, 11-2, 22 are switched on. By means of the switch 28-1, 28-2 the test signal is cut off from the output terminal 5 of the amplifier 1. The gate 7-1, 7-2 of the amplifying transistor 6-1, 6-2 receives the analogue signal via a switch 11-11, 11-2 and transmits the amplified signals to output port 5-1, 5-2 of the amplifier 1. In the normal amplifying mode the gate 20 of the tail current transistor 17 receives the biasing reference voltage via closed switch 22. Since switch 27 is also closed in the normal amplifying mode the amplifying transistor 6 receives the positive supply voltage $V_{DD}$ via the loading resistors 14-1, 14-2.

When switched to the test mode switches 28-1 and 28-2, and switch 24 are closed. At the same time switches 27-1, 27-2, 11-1, 11-2 and 22 are opened. While switching off switch 27 the amplifying transistor 6 is disconnected from the positive supply voltage $V_{DD}$ and cut off. By opening switch 11-1, 11-2 no input signal is supplied to the gate 7-1, 7-2 of the amplifying transistor 6-1, 6-2. By isolating gates of the amplifying transistors 6-1, 6-2 from the input signal via switches 11-1, 11-2 the signal S is isolated from the output port 5-1, 5-2. This ensures that the test signal T supplied to the output port 5-1, 5-2 via the load resistors 14-1, 14-2 is not affected by spurious signals coming from the input terminals 2-1, 2-2.

By switching off switch 22 the transistor 17 does not get a biasing reference voltage. Furthermore its gate 20 is switched to the negative supply voltage $V_{SS}$ by closing switch 24. In this manner the transistor 17 is cut off completely and the tail current going to ground is nullified. The amplifier design as shown in FIG. 6 focus on the tail current sink and loads of the amplifier 1 which are modified by the switches to reconfigure the operation of the amplifier. The design of a conventional amplifier is modified by adding switches that disconnect the amplifying transistor from the incoming signal and the tail current sink transistor from the bias circuitry. The design is modified in such a way that the injection of the test signal T in the signal path has a minimal impact upon the circuit normal operation.

FIGS. 7–12 come from simulation analysis carried out at the operational frequency of 1.6 GHz.

Figure 7A:
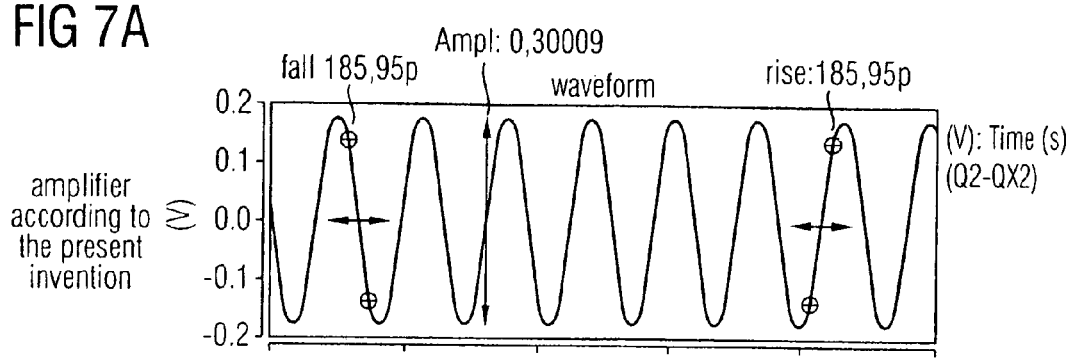
FIG. 7a shows a differential output voltage from an ADfT-analogue amplifier according to the present invention as shown in FIG. 6.
Figure 7B:
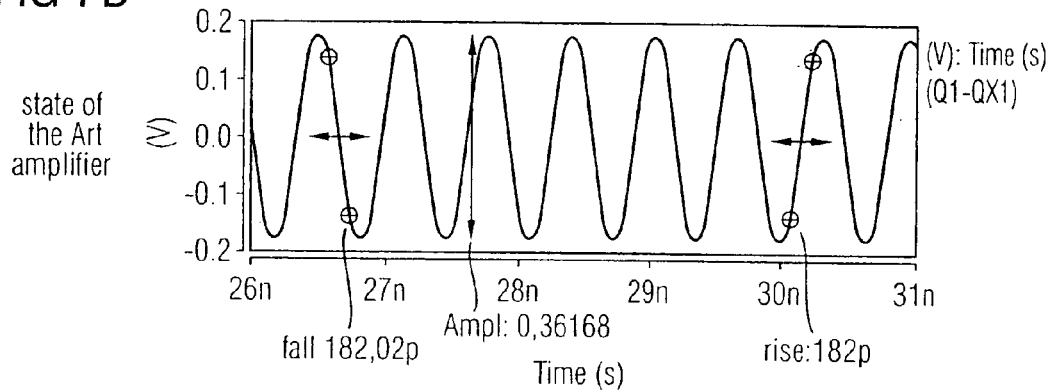
FIG. 7b shows a differential output voltage from an amplifier according to the state of the art as shown in FIG. 4

FIG. 7a, 7b show the differential output wave forms of an original differential amplifier as shown in FIG. 4 in comparison to the differential output of the amplifier 1 according to the present invention as shown in FIG. 6. The input signal used is a monotonic sinusoidal at 1,562 GHz.

Figure 8:
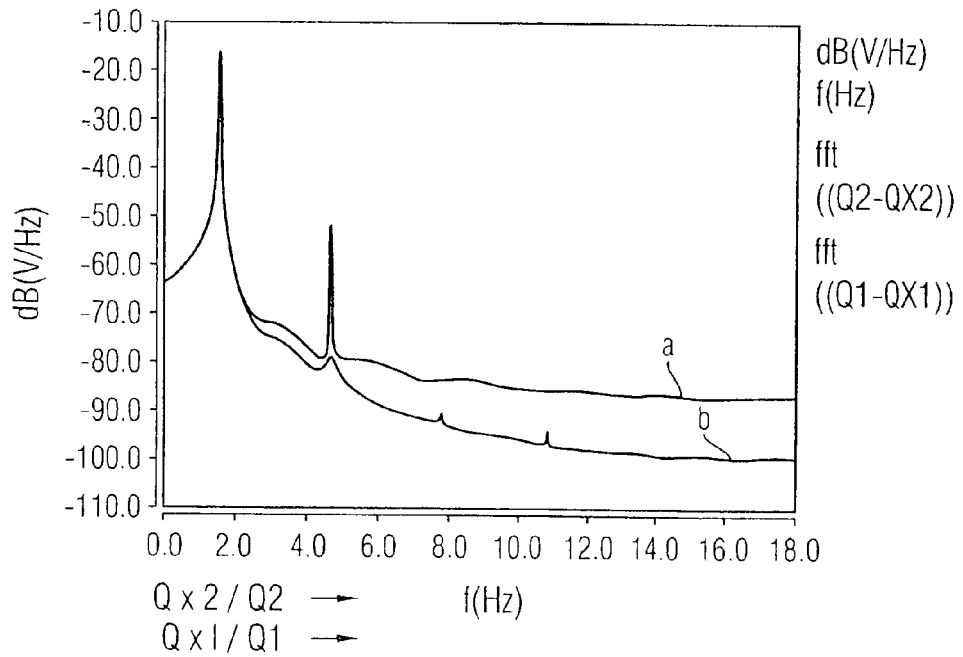
FIG. 8 shows the spectral content of the output voltages of a conventional amplifier and of the analogue amplifier according to the present invention.

FIG. 8 shows the spectral content of the output voltages of the conventional amplifier (a) shown in FIG. 4 and the amplifier (b) according to the present invention as shown in FIG. 6.

The increase of the noise figure at the operation frequency is due mainly to the drop in conversion gain related to the attenuation effect of transistors 11-1 and 11-2. The second largest contribution to the relative increase in the noise figure at the operation frequency is coming from transistor switches 27-1, 27-2 accounting to less than a quarter of the contribution of transistor switches 11-1, 11-2.

Figure 9:
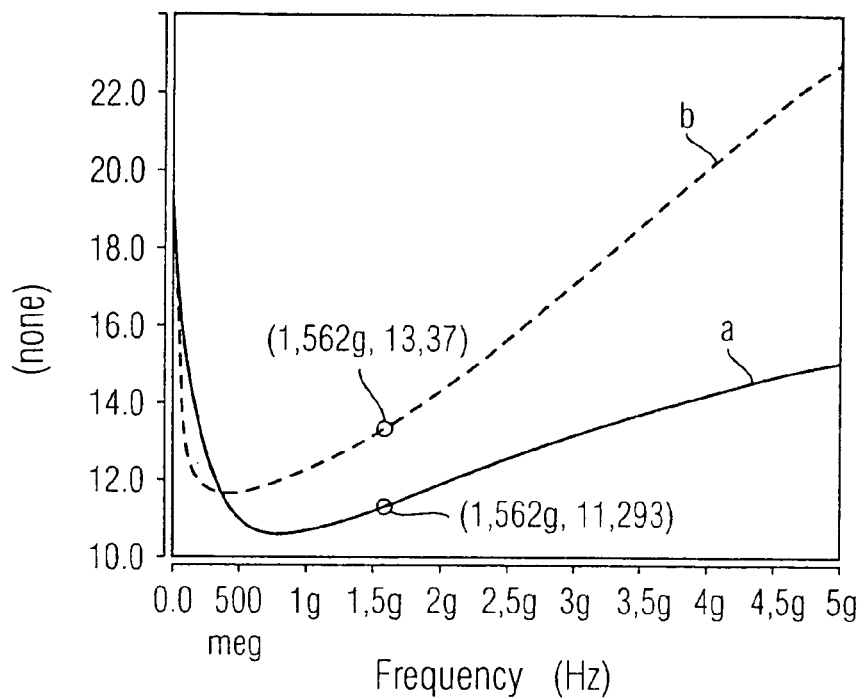
FIG. 9 shows noise figure curves of a conventional amplifier and of the analogue amplifier according to the present invention.
Figure 10:
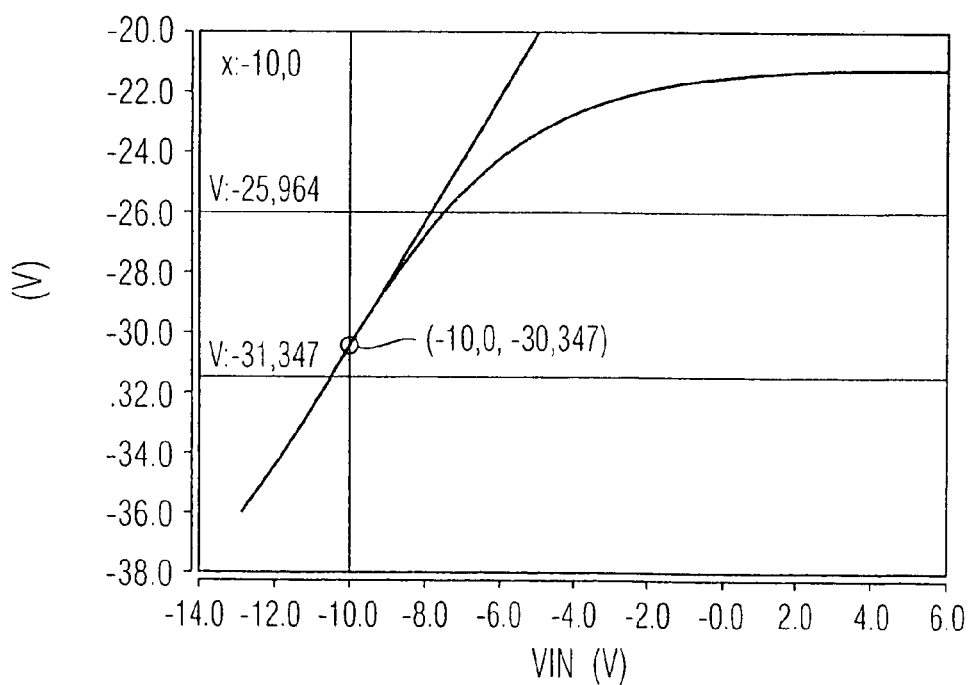
FIG. 10 shows the 1 dB compression point of the conventional amplifier according to the state of the art.
Figure 11:
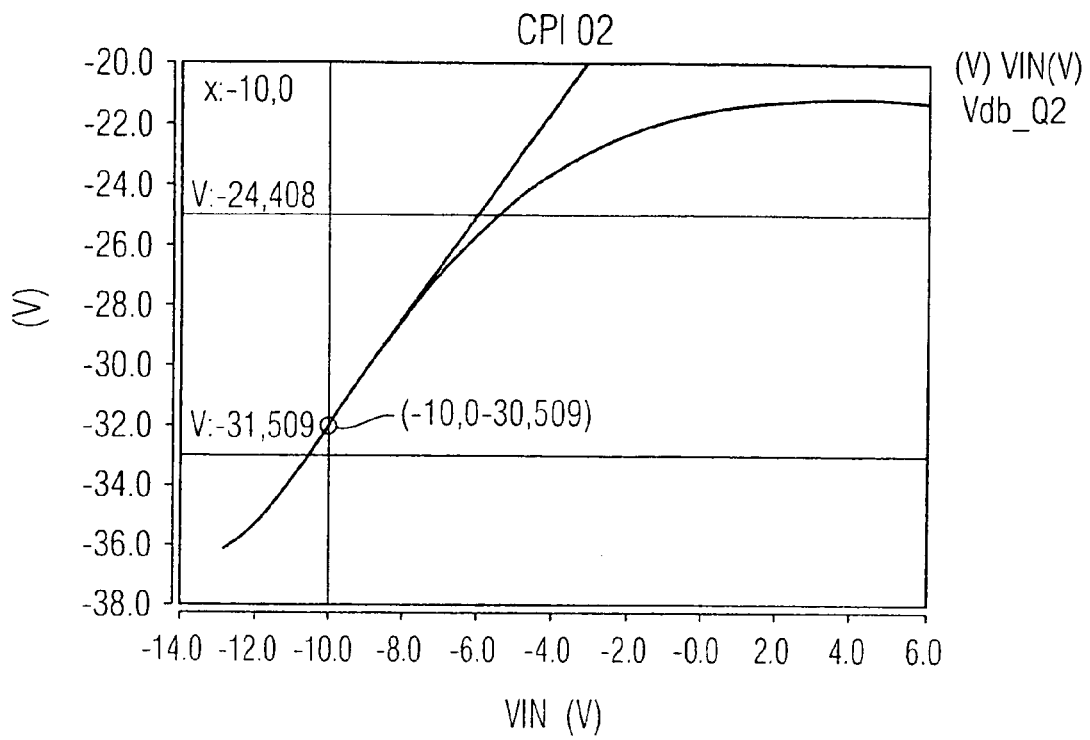
FIG. 11 shows the 1 dB compression point of the analogue amplifier according to the present invention.
Figure 12:
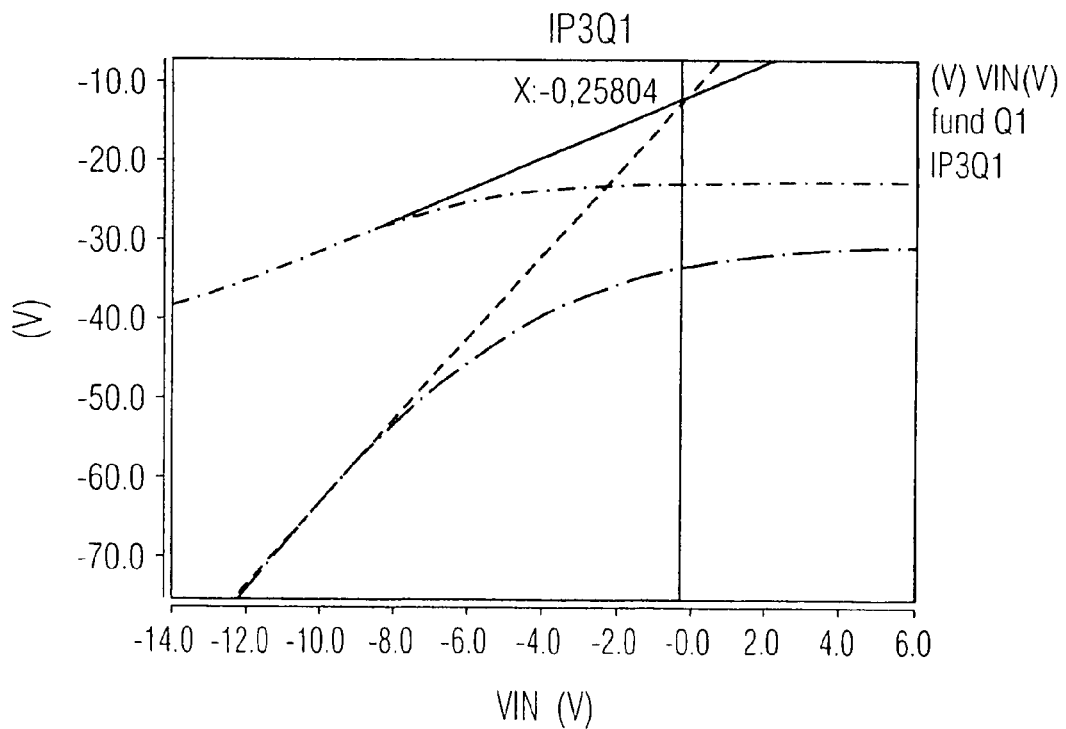
FIG. 12 shows the IP3 ($3^{rd}$ order intersection point) for the conventional amplifier.
Figure 13:
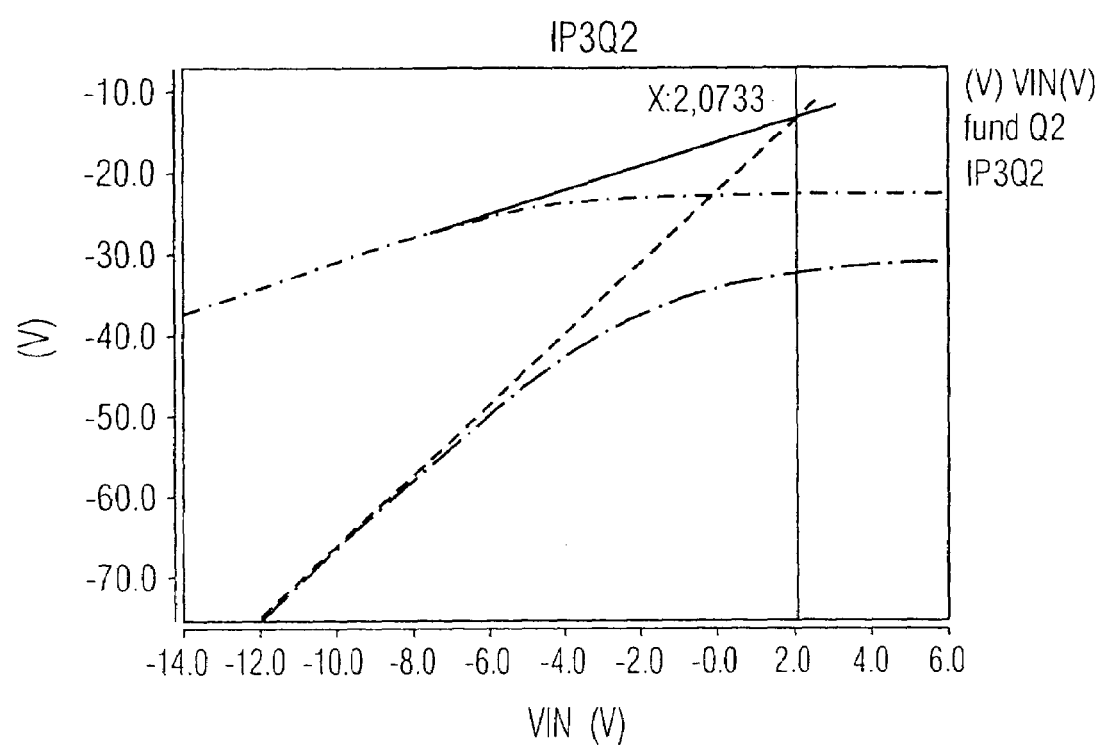
FIG. 13 shows the IP3 for the amplifier according to the present invention.

FIG. 9 shows the plot of noise figures with a measurement mark at a operating frequency (conventional amplifier a; amplifier according to the present invention b).

FIGS. 10 to 13 show different plots of measuring intermodulation distortion products. The performance of the amplifier according to the present invention it is about 1.5 to 2 dBm better than the original amplifier according to the state of the art.

Parasitic capacitance to ground together with the on resistance in transistors 11-1, 11-2 implement a low past filter at the inputs 2-1, 2-2 of the differential amplifier in the modified circuit. The attenuation provided by this filter at the operating frequency which accounts for the gain drop depicted in FIG. 7 is also responsible for the improvement observed in the circuit linearity. Since the filter attenuation reduces the input power to the differential amplifier it behaves better in terms of intermodulation distortion.

Area overhead due to the amplifier design according to the invention accounts for about 9% of the original area due to the original amplifier design. This figure expressed in terms of a total pLL-area, where the amplifier is located, represents about only 0.023% since the amplifier itself takes only about 0.25% of the total pLL-area. In the test mode a low impedance propagation path exist between the test port 3-1, 3-2 and the corresponding circuit output nodes 5-1, 5-2, respectively.

Transistors 28-1, 28-2 used to disconnect the test ports 3-1, 3-2 are dimensioned according to the impedance requirements. These elements are placed in series with the loading resistors.

According to the present invention a device under test can be reconfigured and its outputs multiplexed to inject test signals. Consequently it is possible to increase the controllability of relevant nodes of the circuit under test, and therefore is testability is also enhanced.

The present invention can be adapted to different operating frequencies, ranging from DC to frequencies in the order of tens of GHZ typically used in optical communication circuits. The present invention is applicable to any analogue circuit whose controllability is to be increased.

The modification of the design of a conventional amplifier makes possible to inject a test signal (T) with a minimum impact upon the circuit performances. Further the area overhead due to the circuit modification remains below 10% of that of the differential amplifier.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An arrangement including an analog amplifier having an input port for receiving a first signal and a test input port for receiving test signal, the analog amplifier further comprising a control input port and an output port, the analog amplifier responsive to a first and a second condition present at the control input port, such that when the first condition is present at the control input port, the output port is operably connected to the input port and when the second condition is present at the control input port the output port is operably connected to the test input port;

a load device operably connected to the output port and selectively connectable to a first voltage;

a transistor having a first, a second and a third terminal, the first terminal selectively connectable to the input port, the second terminal operably connected to the output port and the load device; and a tail current sink transistor operably connected to the third terminal and having a terminal selectively connectable to a biasing voltage, such that when the first condition is present at the control input port, biasing voltage is supplied to the terminal of the tail current transistor, the load device is connected to the first voltage and the first terminal is connected to the input port, and when the second condition is present at the control input port, biasing voltage is not supplied to the terminal of the tail current transistor, the load device is not connected to the input port and the first terminal is disconnected from the input port.

2. The arrangement of claim 1, wherein the first condition present at the control input port is a first control signal and the second condition present at the control input port is a second control signal.

3. The arrangement of claim 1, further comprising;

a negative biasing voltage selectively connectable to the terminal of the tail current sink transistor, such that when the second condition is present at the control input port, the terminal of the tail current sink transistor is operably connected to the negative biasing voltage.

4. The arrangement of claim 1, wherein the load device is selectively connectable to the test input port, such that when the second condition is present at the control input port, the load device is operably connected to the test input port.

5. The arrangement of claim 1, wherein the amplifier is a fully differential amplifier.

6. The arrangement of claim 1, further comprising;

a test pattern generator operatively connected to the test input port.

7. The arrangement of claim 1, wherein the test input port is capable of operable connection to an external test pattern generator.

8. A method of switching the connectivity of an output port of an analog amplifier from an input port to a test input port, comprising the steps of:

providing an amplifying transistor operably connected to the output port;

providing power to the amplifying transistor;

providing a tail current sink transistor having a terminal, the tail current sink transistor operably connected to the amplifying transistor and having a biasing voltage applied to the terminal;

providing a control signal;

connecting the test input port to the output port;

disconnecting the amplifying transistor from the power; and reducing the biasing voltage at the terminal of the tail current sink transistor.

9. The method of claim 8, wherein the step of reducing the biasing voltage comprises the step of removing the biasing voltage from the terminal of the tail current sink transistor.

10. The method of claim 8, further comprising, after the step of providing a control signal, the step of applying a negative biasing voltage to the terminal of the tail current sink transistor.

11. The method of claim 8, wherein the step of providing power to the amplifying transistor comprises the step of:

providing power to the amplifying transistor through a load device, and wherein the step of connecting the test input port to the output port comprises the step of:

connecting the test input port to the output port through the load device.

* * * * *